United States Patent [19]
Murray et al.

[11] Patent Number: 5,844,852
[45] Date of Patent: Dec. 1, 1998

[54] MEMORY ARRAYS WITH INTEGRATED BIT LINE VOLTAGE STABILIZATION CIRCUITRY

[75] Inventors: Robert J. Murray, Hillsboro; Paul D. Madland, Beaverton, both of Oreg.

[73] Assignee: Intel Corporation, Santa Clara, Calif.

[21] Appl. No.: 907,754

[22] Filed: Aug. 8, 1997

Related U.S. Application Data

[63] Continuation of Ser. No. 559,026, Nov. 16, 1995, abandoned.

[51] Int. Cl.$^6$ .................................................. G11C 7/00
[52] U.S. Cl. .......................... 365/203; 262/202; 262/190
[58] Field of Search .................................. 365/202, 203, 365/190

[56] References Cited

U.S. PATENT DOCUMENTS

| | | | |
|---|---|---|---|
| 5,023,841 | 6/1991 | Akrout et al. | 365/205 |
| 5,309,401 | 5/1994 | Suzuki et al. | 365/203 |
| 5,365,488 | 11/1994 | Matsushita | 365/203 |
| 5,392,249 | 2/1995 | Kan | 365/203 |
| 5,574,687 | 11/1996 | Nakase | 365/189.06 |

*Primary Examiner*—David Nelms
*Assistant Examiner*—Hoai V. Ho
*Attorney, Agent, or Firm*—Blakely, Sokoloff, Taylor & Zafman LLP

[57] ABSTRACT

The precharged bit lines of a memory array are provided with corresponding pass gate devices and a common complementary regulation and control circuitry to keep the precharged bit lines at a voltage below a first voltage and to counter-act any leakage to Vcc through a small current drain to a reference voltage. As a result, the voltage on the precharged bit lines are prevented from moving closer to Vcc, even during a prolonged idle period, and failure will not occur, when the memory cells are accessed again after the prolonged idle period.

18 Claims, 4 Drawing Sheets

| CTRL 1 | CTRL 0 | MODE | VREF | LEAKENABLE# |
|---|---|---|---|---|
| 0 | 0 | NORMAL | $V_{CC} - V_t$ | $V_{SS}$ |
| 0 | 1 | DISABLE CURRENT SOURCE & LEAVE VREF TO FLOAT TO $V_{CC} - V_t$ | $V_{CC} - V_t$ (floating) | $V_{SS}$ |
| 1 | 0 | DISABLE CURRENT SOURCE & FORCE VREF TO $V_{CC}$ | $V_{CC}$ | $V_{SS}$ |
| 1 | 1 | DISABLE CURRENT SOURCE FOR STANDARD CURRENT BREAKAGE AND DEVICE INTEGRITY TEST | $V_{CC}$ | $V_{CC}$ |

*FIG. 3*

MEMORY ARRAYS WITH INTEGRATED BIT LINE VOLTAGE STABILIZATION CIRCUITRY

This is a continuation of application Ser. No. 08/559,026, filed Nov. 16, 1995, now abandoned.

BACKGROUND OF THE INVENTION

1. Field of the Invention

The present invention relates to the field of semiconductor devices. More specifically, the present invention relates to embedded memory on integrated circuit devices as well as standalone memory modules.

2. Background Information

Today, many embedded memory on integrated circuit devices, such as on-chip cache memory of a microprocessor, as well as standalone memory modules, such as level two cache memory of a computer system, employ memory arrays that include precharge circuitry based on n-channel devices. These memory arrays have an infrequent failure mode known in the art as push-out in the memory access time.

This type of failure is caused by the memory array having a small voltage leakage to Vcc, resulted from prolonged idle time. While the memory cells are not being accessed or idle, the bit lines of the memory cells get charged up to Vcc. When the memory cells are accessed again, the Vcc drops, and the memory array is forced to operate in a region where the sense-amp is very slow. At this time, the bit lines are charged to a voltage near or above Vcc.

However, this type of failure occurs very rarely, only after several hundred milliseconds of idle time, thus making the failures very difficult and expensive to test. Some of the tests devised fail 100% of the parts. Thus, it is desirable to be able to eliminate this type of failures. As will be disclosed in more details below, the present invention achieves these and other desired results.

SUMMARY OF THE INVENTION

The precharged bit lines of memory arrays are provided with corresponding pass gate devices and a common complementary regulation and control circuitry to keep the precharged bit lines at a first voltage and to counter-act any leakage to Vcc through a small current drain to a reference voltage.

The drains of the pass gate devices are correspondingly coupled to the precharged bit lines, whereas, the sources are coupled to a common voltage reference (vref) node, and the gates are coupled to a leakage control enable (leakenable#) node. The common complementary regulation and control circuitry includes a current source coupled to the vref node, through a pull-down device.

During operation, when voltage stabilization is enabled, the current source sets the leakage current for the entire memory array, while the voltage at the vref node is mainly determined by the precharge circuitry. Since a small leakage is present on each bit line, the sub-threshold currents and the pull-down device together establish a stable controlled voltage on the precharged bit lines. As a result, any additional leakage currents can not dominate the charging of the bit lines, even during a prolonged idle period. Therefore, the voltage on the precharged bit lines are prevented from moving closer to Vcc, and the failure will not occur when the memory cells are accessed again after the prolonged idle period.

BRIEF DESCRIPTION OF DRAWINGS

The present invention will be described by way of exemplary embodiments, but not limitations, illustrated in the accompanying drawings in which like references denote similar elements, and in which:

FIG. 3 illustrates various operational options implemented in the preferred embodiment of FIG. 2.

DETAILED DESCRIPTION OF THE INVENTION

In the following description, for purposes of explanation, specific numbers, materials and configurations are set forth in order to provide a thorough understanding of the present invention. However, it will be apparent to one skilled in the art that the present invention may be practiced without the specific details. In other instances, well known features are omitted or simplified in order not to obscure the present invention.

Figure 1:
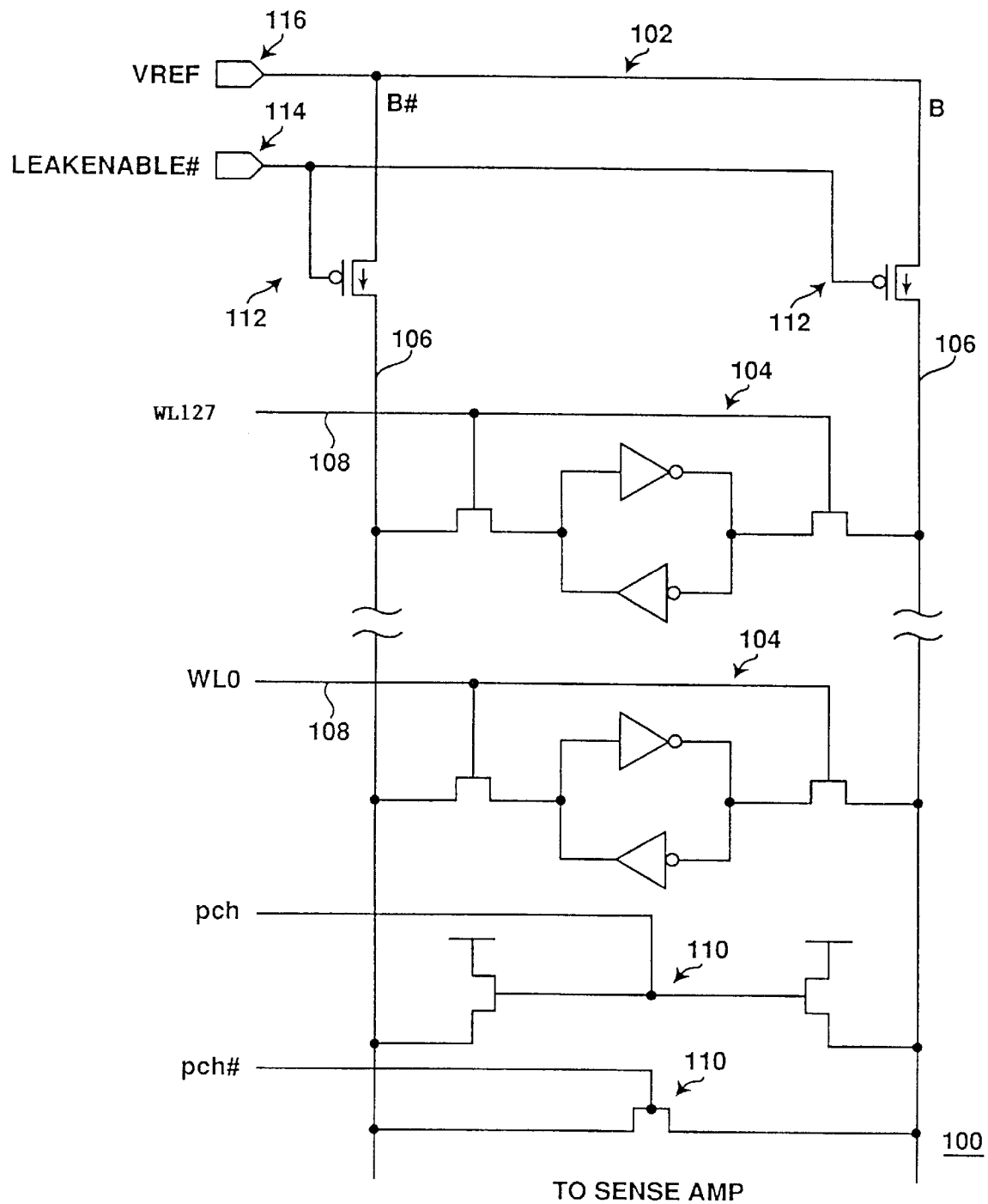
FIG. 1 illustrates an exemplary column of memory cells of a memory array incorporated with the teachings of the present invention.

Referring now to FIG. 1, wherein an exemplary column of memory cells of a memory array incorporated with the teachings of the present invention is shown. Exemplary memory column 102 of memory array 100 includes a plurality of memory cells 104, bit lines 106, and word lines 108, coupled to each other shown. Additionally, exemplary memory column 102 further includes precharge circuitry 110 for precharging bit lines 106. More importantly, in accordance to the present invention, precharged bit lines 106 are provided with corresponding pass gate devices 112, which in turn are coupled to a common complementary regulation and control circuitry through the nodes labeled "vref" and "leakenable#", to be more fully described below.

Except for the provision of pass gate devices 112 and the common complementary regulation and control circuitry, memory array 100 is intended to represent a broad category of memory found in digital systems, including but not limited to embedded memory, such as on-chip cache memory of a microprocessor, as well as standalone memory, such as level two cache memory of a computer system.

The pass gate devices 112 and the common complementary regulation and control circuitry are provided to keep precharged bit lines 106 from exceeding the voltage level that affects the functional operational of the sense amps, and to counter-act any leakage to Vcc through a small current drain to a reference voltage (vref). As a result, the voltage on precharged bit lines 106 are prevented from moving closer to Vcc, even during a prolonged idle period, and the failure will not occur when memory cells 104 are accessed again after the prolonged idle period.

For the illustrated embodiment, pass gate devices 112 are p-channel devices. However, it will be appreciated by those skilled in the art that pass gate devices 112 may be either n or p type. As shown, the drains of pass gate devices 112 are correspondingly coupled to precharged bit lines 106, whereas, the sources are coupled to common voltage reference (vref) node 116, and the gates are coupled to leakage control enable (leakenable#) node 114. In the preferred embodiment, the p-channel pass gate devices 112 are long channel devices. The size of pass gate devices 112 are adjusted to minimize the degrading of voltage development on bit lines 106 during a read access to memory cells 104, as well as to minimize interference to a write access to memory cells 104.

Figure 2:
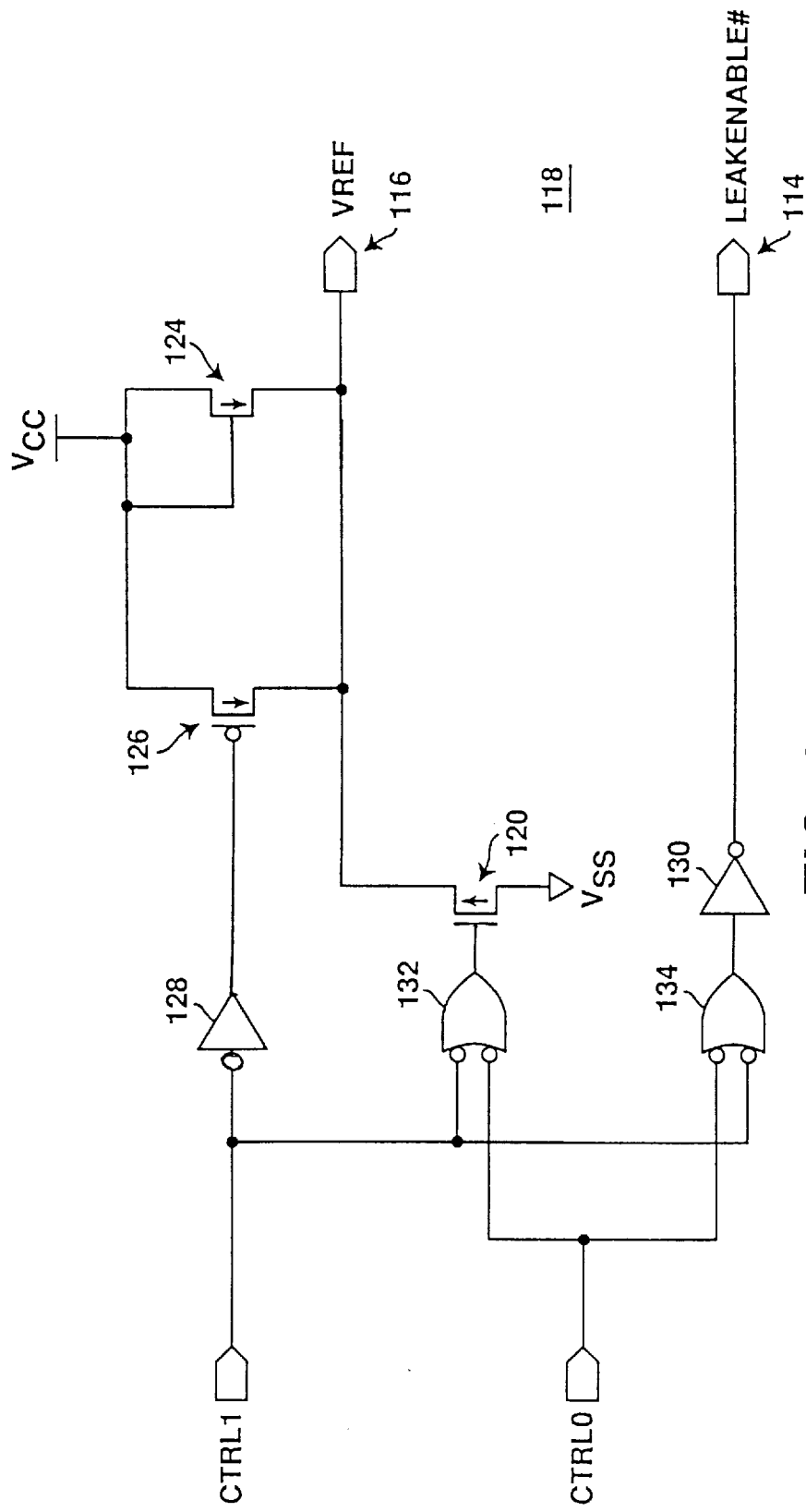
FIG. 2 illustrates a preferred embodiment of the common complementary regulation and control circuitry of the present invention.

FIG. 2 illustrates a preferred embodiment of the common complementary regulation and control circuitry of the present invention. As shown, for the illustrated embodiment, common complementary regulation and control circuitry 118 includes current source Vss coupled to vref node 116, through pull-down device 120. Furthermore, regulation and control circuitry 118 includes driver 130 for turning leakenable# (i.e. voltage stabilization) on and off, in response to received control inputs (to be described in more detail later).

During operation, when voltage stabilization is enabled (leakenable# driven active low), current source Vss sets the leakage current for the entire memory array 100, while the voltage at vref node 116 is mainly determined by precharge circuitry 110. Since a small leakage is present on each precharged bit line 106, the sub-threshold currents and pull-down device 120 together establish a stable controlled voltage on precharged bit lines 106. As a result, any additional leakage currents can not dominate the charging of bit lines 106, even during a prolonged idle period. Therefore, the voltage on precharged bit lines 106 are prevented from moving closer to Vcc, and the failure will not occur when memory cells 104 are accessed again after the prolonged idle period.

Still referring to FIG. 2, the common complementary regulation and control circuitry 118 is further provided with additional devices to implement a number of preferred auxiliary functions. As shown, n-channel device 124 is provided to give additional support to vref node 116 to prevent discharge of bit lines 106, even in the absence of a precharge. P-channel device 126 is provided to improve the ease of testing. P-channel device 126 facilitate charging of vref node 116 to Vcc to simulate the failure mode, which is very useful for characterizing the sense amp operation.

Furthermore, driver 128, AND gate 132 and OR gate 134 are provided to implement a number of operational options, using control signals CTRL1 and CTRL0. Driver 128 receives and outputs inverted CTRL0. Both AND gate 132 and OR gate 134 receive inverted CTRL1 and CTRL2 as inputs, and output the logical AND and logical OR of these inverted inputs respectively. Together, they implement the operational options summarized in FIG. 3.

As shown, setting both CTRL0 and CTRL1 to zeroes place the regulation and control circuitry 118 in its normal operation mode, causing the voltage at vref node 116 to be at the difference between Vcc and a threshold voltage Vt, whereas the voltage at leakenable# node 114 to be at Vss. On the other hand, if CTRL0 is set to one instead, current source Vss is disabled, leaving the voltage at vref node 116 to float (voltage at leakenable# node 114 would still be at Vss). Similarly, if CTRL1 is set to one, current source Vss is disabled, however, this time, the voltage at vref node 116 will be forced to Vcc (voltage at leakenable# node 114 is still Vss). Finally, if both CTRL0 and CTRL1 are set to one, current source Vss is disabled for standard current leakage and device integrity testing, forcing the voltage at vref node 116 to Vcc and disabling leakage control (i.e. leakenable# goes high). The voltage at leakenable# node 114 will be at Vcc also.

Figure 4A:
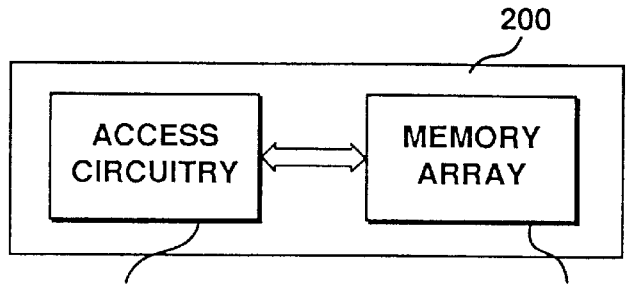
FIGS. 4a–4c illustrate exemplary applications of the present invention.
Figure 4B:
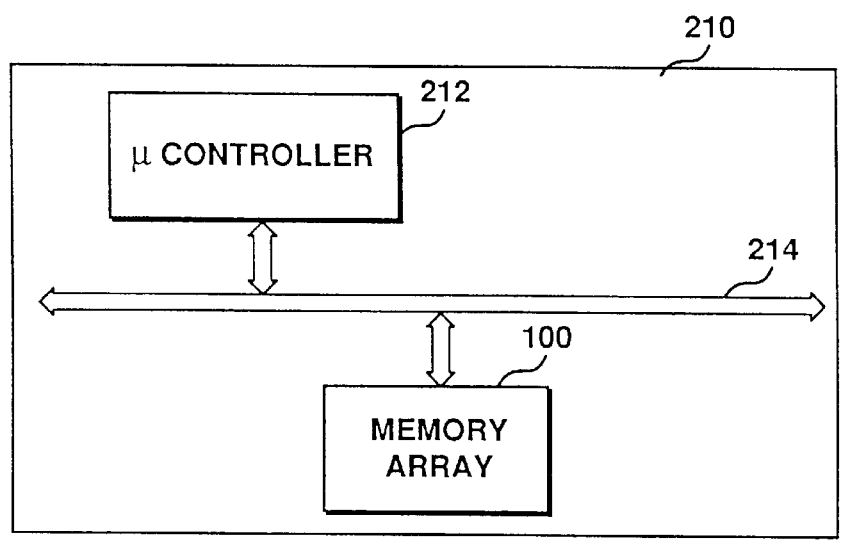
Figure 4C:
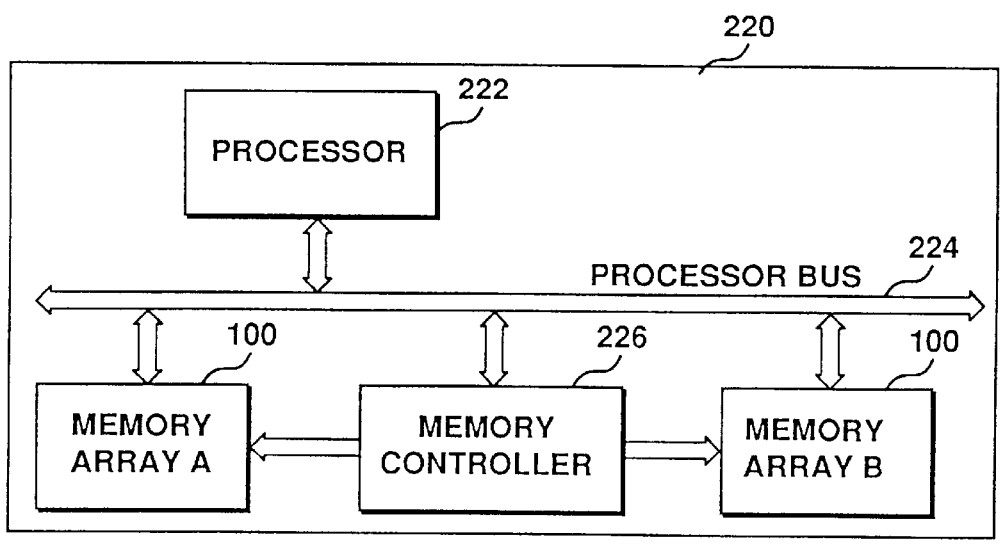

FIGS. 4a–4c illustrate exemplary applications of the present invention. FIG. 4a illustrates incorporation of the improved memory array 100 of the present invention in an integrated circuit 200. In other words, improved memory array 100 is being used as embedded memory. Integrated circuit 200 further includes access circuitry 202 coupled to memory array 100. Particular examples of integrated circuit 200 include but not limited to a microprocessor. FIG. 4b illustrates incorporation of the improved memory array 100 of the present invention in a digital component 210. In other words, improved memory array 100 is being used as a standalone memory device. Digital component 210 further includes microcontroller 212 and internal bus 214 coupled to each other and to memory array 100 as shown. Particular examples of digital component 210 include but not limited to a device controller. FIG. 4c illustrates incorporation of the improved memory array 100 of the present invention in a digital system 220. In other words, improved memory array 100 is also being used as a standalone memory device. Digital system 220 includes processor 222, processor bus 224, and memory controller 226 coupled to each other and memory array 100 as shown. Particular examples of digital system 220 include but not limited to a computer system.

Thus, a memory array with integrated bit line voltage stabilization circuitry has been described. While the method and apparatus of the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

What is claimed is:

1. An apparatus comprising a memory array having columns of memory cells for storing data, a plurality of precharged bit line pairs correspondingly coupled to the memory cells for facilitating reading from and writing into the memory cells, and a bit line voltage stabilization circuit coupled to the precharged bit line pairs for keeping voltage on the precharged bit line pairs below a first voltage level during an idle period, and to counter-act any leakage to Vcc through a small current drain to a reference voltage during the idle period.

2. The apparatus as set forth in claim 1, wherein the bit line voltage stabilization circuit comprises a plurality of pass gate device pairs correspondingly coupled to the precharged bit line pairs, the pass gate device pairs being also coupled to a common reference voltage node through which the small current drain to the reference voltage is provided, and a common leakage enable node for enabling voltage stabilization.

3. The apparatus as set forth in claim 2, wherein,
each precharged bit line pair comprises a first and a second precharged bit line; and
each pass gate device pair comprises a first and a second pass gate device having a first and a second source respectively, coupled to the reference voltage node, a first and a second drain respectively, coupled correspondingly to the first and the second precharged bit lines, and a first and a second gate respectively, coupled to the leakage enable node.

4. The apparatus as set forth in claim 2, wherein the bit line voltage stabilization circuit further comprises a regulation and control circuit coupled to the common reference voltage node and the common leakage enable node for enabling and disabling voltage stabilization and for supplying a first current to the entire memory array.

5. The apparatus as set forth in claim 4, wherein the regulation and control circuit comprises a current source coupled to the common reference voltage node through a pull down device for supplying the first current to the entire memory array.

6. The apparatus as set forth in claim 5, wherein the regulation and control circuit further comprises an n-channel device coupled to a first point in between the pull down device and the reference voltage node for preventing discharge of the bit lines even if the bit lines are not precharged.

7. The apparatus as set forth in claim 5, wherein the regulation and control circuit further comprises a p-channel device coupled to a first point in between the pull down device and the reference voltage node for charging the reference voltage node to Vcc.

8. The apparatus as set forth in claim 5, wherein the regulation and control circuit further comprises a plurality of control elements coupled to the current source, the pull down device, and the leakage enable node for controlling the current source and the pull down device, and for enabling and disabling voltage stabilization.

9. The apparatus as set forth in claim 8, wherein the control elements controls the current source, the pull down device, and the leakage enable node in a manner placing the regulation and control circuit in a selected one of a plurality of operating options.

10. The apparatus as set forth in claim 9, wherein the operating options include an operating option under which voltage at the reference voltage node is equal to the difference between Vcc and a threshold voltage, and voltage at the leakage enable node is equal to voltage a the current source.

11. The apparatus as set forth in claim 9, wherein the operating options include an operating option under which voltage at the reference voltage node is allow to float, and voltage at the leakage enable node is equal to voltage a the current source.

12. The apparatus as set forth in claim 9, wherein the operating options include an operating option under which voltage at the reference voltage node is equal to Vcc, and voltage at the leakage enable node is equal to voltage a the current source.

13. The apparatus as set forth in claim 9, wherein the operating options include an operating option under which voltages at the reference voltage node and voltage at the leakage enable node are both equal to Vcc.

14. The apparatus as set forth in claim 2, wherein each pass gate device pairs comprises a first and a second pmos transistor.

15. A single integrated circuit comprising a memory array having columns of memory cells for storing data, a plurality of precharged bit line pairs correspondingly coupled to the memory cells for facilitating reading from and writing into the memory cells, and a bit line voltage stabilization circuit coupled to the precharged bit line pairs for keeping voltage on the precharged bit line pairs below a first voltage level during an idle period, and to counter-act any leakage to Vcc through a small current drain to a reference voltage during the idle period; and access circuitry coupled to the memory array for accessing data stored in the memory array.

16. The apparatus as set forth in claim 15, wherein the apparatus is a microprocessor and the memory array is embedded cache memory of the microprocessor.

17. A digital component comprising a memory array having columns of memory cells for storing data, a plurality of precharged bit line pairs correspondingly coupled to the memory cells for facilitating reading from and writing into the memory cells, and a bit line voltage stabilization circuit coupled to the precharged bit line pairs for keeping voltage on the precharged bit line pairs below a first voltage level during an idle period, and to counter-act any leakage to Vcc through a small current drain to a reference voltage during the idle period; and a microcontroller coupled to the memory array for accessing data stored in the memory array.

18. A computer system comprising a memory array having columns of memory cells for storing data, a plurality of precharged bit line pairs correspondingly coupled to the memory cells for facilitating reading from and writing into the memory cells, and a bit line voltage stabilization circuit coupled to the precharged bit line pairs for keeping voltage on the precharged bit line pairs below a first voltage level during an idle period, and to counter-act any leakage to Vcc through a small current drain to a reference voltage during the idle period; and a processor coupled to the memory array for accessing data stored in the memory array.

* * * * *